(12) United States Patent
Ma et al.

(10) Patent No.: US 12,287,455 B2
(45) Date of Patent: Apr. 29, 2025

(54) OXYGEN-LOSS RESISTANT TOP COATING FOR OPTICAL ELEMENTS

(71) Applicant: ASML Netherlands B.V., Veldhoven (NL)

(72) Inventors: Yue Ma, Escondido, CA (US); Marcus Adrianus Van De Kerkhof, Helmond (NL); Qiushi Zhu, Harbin (CN); Klaus Martin Hummler, San Diego, CA (US); Peter Matthew Mayer, San Diego, CA (US); Kay Hoffmann, San Diego, CA (US); Andrew David LaForge, Poway, CA (US); Igor Vladimirovich Fomenkov, San Diego, CA (US); Daniel John William Brown, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 199 days.

(21) Appl. No.: 17/625,426

(22) PCT Filed: Jun. 26, 2020

(86) PCT No.: PCT/EP2020/067986
§ 371 (c)(1),
(2) Date: Jan. 7, 2022

(87) PCT Pub. No.: WO2021/008856
PCT Pub. Date: Jan. 21, 2021

(65) Prior Publication Data
US 2022/0260756 A1 Aug. 18, 2022

Related U.S. Application Data

(60) Provisional application No. 63/033,554, filed on Jun. 2, 2020, provisional application No. 62/874,869, filed on Jul. 16, 2019.

(51) Int. Cl.
G02B 5/08 (2006.01)
G02B 1/14 (2015.01)
G03F 7/00 (2006.01)

(52) U.S. Cl.
CPC ............. *G02B 1/14* (2015.01); *G02B 5/0891* (2013.01); *G03F 7/70175* (2013.01); *G03F 7/70316* (2013.01); *G03F 7/70958* (2013.01)

(58) Field of Classification Search
CPC ............. G03F 7/70958; G03F 7/70316; G03F 7/70175; G02B 1/14; G02B 5/0891
See application file for complete search history.

(56) References Cited

U.S. PATENT DOCUMENTS

| 9,865,743 B2 | 1/2018 | Yamazaki |
| 2002/0012797 A1 | 1/2002 | Bijkerk et al. |

(Continued)

FOREIGN PATENT DOCUMENTS

| CN | 1737687 A | 2/2005 |
| TW | 201431075 A | 8/2014 |

(Continued)

OTHER PUBLICATIONS

Bajt et al., Surface Science Reports, 63, (2008), pp. 73-99 (Year: 2008).*

(Continued)

*Primary Examiner* — Steven H Whitesell
(74) *Attorney, Agent, or Firm* — DiBerardino McGovern IP Group LLC

(57) ABSTRACT

Provided is an optical element for a lithographic apparatus. The optical element includes a capping layer that includes oxygen vacancies therein. The oxygen vacancies prevent attack of the capping layer by preventing hydrogen and other species from penetrating the capping layer and underlying layers. The capping layer provides a low hydrogen recom- (Continued)

bination rate enabling hydrogen to clean the surface of the optical element. The capping layer may include an alloyed metal, a mixed metal oxide or a doped metal oxide and it may be a ruthenium capping layer that includes one or more dopants therein.

10 Claims, 2 Drawing Sheets

(56) References Cited

U.S. PATENT DOCUMENTS

| | | |
|---|---|---|
| 2005/0199830 A1* | 9/2005 | Bowering ............ G03F 7/70916 250/504 R |
| 2006/0160034 A1* | 7/2006 | Wurm .................... B82Y 40/00 430/330 |
| 2011/0228237 A1 | 9/2011 | Trenkler et al. |
| 2012/0069311 A1* | 3/2012 | Schwarzl ............ G03F 7/70958 977/890 |
| 2014/0211179 A1 | 7/2014 | von Blanckenhagen et al. |
| 2019/0011828 A1 | 1/2019 | Van Zwol et al. |
| 2019/0104604 A1 | 4/2019 | Chien et al. |
| 2019/0129299 A1 | 5/2019 | Nasalevich et al. |
| 2019/0384163 A1 | 12/2019 | Kim et al. |

FOREIGN PATENT DOCUMENTS

| | | | | |
|---|---|---|---|---|
| WO | WO-2017067813 A2 * | 4/2017 | ............... | G03F 1/38 |
| WO | 2017186486 A1 | 11/2017 | | |
| WO | 2019170356 A1 | 9/2019 | | |

OTHER PUBLICATIONS

Feng et al. "Direct Observation of Oxygen Vacancy Distribution across Yttria-Stabilized Zirconia Grain Boundaries", ACS Nano 2017, 11, 11376-11382 (Year: 2017).*
Sirajuddeen et al. "FP-LAPW investigation of electronic, magnetic, elastic and thermal properties of Fe-doped zirconium nitride", AIP Advances 4, 057121 (2014) (Year: 2014).*
Chang et al. "Theoretical calculation and analysis of ZrO2 spherical nanometer powders", Journal of Advanced Ceramics 2013, 2(1): 21-25 (Year: 2013).*
Lau et al. "Lattice dielectric and thermodynamic properties of yttria stabilized zirconia solids", J. Phys.: Condens. Matter 21 (2009) 145402 (Year: 2009).*
Wiebo van Toledo, European International Searching Authority, International Search Report and Written Opinion, corresponding PCT Application No. PCT/EP2020/067986, mailed Oct. 7, 2020, 12 pages total.

* cited by examiner

OXYGEN-LOSS RESISTANT TOP COATING FOR OPTICAL ELEMENTS

CROSS REFERENCE TO RELATED APPLICATION

This application claims priority to U.S. Application No. 62/874,869, filed Jul. 16, 2019 and titled OXYGEN-LOSS RESISTANT TOP COATING FOR OPTICAL ELEMENTS; and U.S. Application No. 63/033,554, filed Jun. 2, 2020 and titled OXYGEN-LOSS RESISTANT TOP COATING FOR OPTICAL ELEMENTS, both of which are incorporated herein in their entireties by reference.

FIELD

The present invention relates to optical elements for lithographic apparatuses as well as lithographic apparatuses including such optical elements.

BACKGROUND

A lithographic apparatus is a machine that applies a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses extreme ultraviolet (EUV) radiation, being electromagnetic radiation having a wavelength within the range 4-20 nm, may be used to form smaller features on a substrate than a lithographic apparatus that uses, for example electromagnetic radiation with a higher wavelength such as 193 nm, for example.

EUV radiation is generally produced by depositing energy via a laser beam into a fuel, typically tin, which creates a plasma that emits EUV radiation during de-excitation and recombination of electrons with ions of the plasma. The emitted radiation is emitted in all directions and so a collector mirror is positioned and configured to focus the radiation. The laser beam which energises the fuel is provided through an opening in the centre of the collector mirror. In an EUV lithography apparatus, it is desirable to provide as much of the generated EUV radiation to the substrate which is subject to the lithography process as possible. It is therefore desirable to minimize EUV radiation losses.

Due to the way by which EUV radiation is generated, for example by illumination of a tin droplet with a laser to form a tin plasma, there is a high tin vapour pressure in the region of the collector mirror and tin atoms may deposit on the surface of the collector. The deposited tin may be removed by reaction with hydrogen radicals (H*). The reaction of tin with hydrogen produces tin hydrides, which are gaseous at ambient temperatures. These gases are therefore able to take away the tin which deposits on the collector mirror. The hydrogen gas may be provided through a hole or aperture at the centre of the collector mirror through which the laser is fired. Hydrogen gas may also be provided via a tubular body which is constructed and arranged to guide a gas flow in a direction substantially transverse to the reflective surface and which flows radially outwardly over the collector. Hydrogen may also be provided from the edge of the collector mirror in order to protect and clean the outer portion of the collector mirror.

Pellicles protect optical components of a lithographic apparatus, such as masks or other patterning devices. Pellicles may also be used to provide a passage for lithographic radiation between regions of the lithography apparatus which may be sealed from one another. Pellicles may also be used as filters, such as spectral purity filters or as part of a dynamic gas lock of a lithographic apparatus.

While the present disclosure generally refers to optical elements in the context of lithography apparatuses such as collector mirrors for EUV lithography apparatuses, optical elements find application in various types of apparatuses other than lithography apparatuses and pellicles, dynamic gas lock membranes and spectral purity filters are also considered optical elements. The optical elements may also be used for lithographic apparatuses utilising radiation of shorter wavelength than is currently used.

In addition, it is desirable to improve the lifespan of optical elements within a lithographic apparatus, such as the collector mirror, pellicle, or components of the dynamic gas lock. These optical elements are exposed to the harsh environment of the lithographic apparatus when in use and so can become damaged over time. It is desirable to prevent, reduce, or eliminate damage to such optical elements.

In a lithographic apparatus (and/or method) it is desirable to minimise the losses in intensity of radiation which is being used to form a pattern on a resist coated substrate. One reason for this is that, ideally, as much radiation as possible should be available for applying a pattern to a substrate, for instance to reduce the exposure time and increase throughput. It is therefore desirable to keep the collector mirror as clean as reasonably possible since contamination reduces the reflectivity of the mirror. At the same time, it is desirable to minimise the amount of undesirable radiation (e.g. out-of-band) radiation that is passing through the lithographic apparatus and which is incident upon the substrate.

The present invention has been devised in an attempt to address at least some of the problems identified above.

SUMMARY

According to a first aspect of the present invention, there is provided an optical element comprising a capping layer that includes a plurality of oxygen vacancies therein. The optical element may be an optical element for a lithographic or other apparatus may be any of the optical elements as described herein.

In one embodiment, the capping layer may comprise a doped zirconium oxide. The zirconium oxide may be doped with a trivalent cation in its oxidized state such as but not limited to yttrium oxide, $Y_2O_2$.

While the present disclosure generally refers to capping layers for optical elements in the context of lithography apparatuses such as collector mirrors for EUV lithography apparatuses, the present disclosure finds application in optical elements such as pellicles, dynamic gas lock membranes and spectral purity filters and in various types of apparatuses other than lithography apparatuses and also as coatings on various other types of optical members.

In an EUV lithography apparatus, EUV radiation may be created by illuminating a tin droplet with a laser to form a tin plasma. This results in a high tin vapor pressure in the region of the collector mirror and tin atoms tend to deposit on the surface of the collector mirror. Further, part of unconsumed tin during plasma generation may also end up on the collector mirrors in the form of nano and micro particulates. The deposited tin may be removed by reaction with hydrogen radicals (H*). The reaction of tin with hydrogen radicals produces tin hydrides, which are gaseous at the temperatures at which an EUV lithography apparatus is operated and at ambient temperatures. These gases are therefore able to take away tin which has deposited on the collector mirror. However, the atomic hydrogen provided to remove tin deposits also reacts with and attacks conventional capping layers of optical components such as the collector mirror. When the capping layer is reduced by the hydrogen such as in a conventional capping layer, the rate of recombination of hydrogen radicals at the collector mirror cap layer increases and the removal of tin contamination on the surface of the collector mirror is adversely affected, i.e. the tin removal rate is reduced due to loss of available hydrogen radicals due to their recombination. This results in a shortened operational lifetime of the collector mirror. In order to mitigate the reduction of the surface of the collector mirror, oxygen containing compounds can be added to the hydrogen gas within the lithography apparatus to oxidize the surface of the collector mirror. The amount of oxygen added is limited due to unwanted consequences of other metallic surfaces in the EUV source vessel and EUV transmission loss. When the capping layer becomes damaged during use, the collector cannot be refurbished with simple cleaning and must go through an expensive and time consuming rebuild cycle. With maximum allowable oxygen levels used in source operation, further mitigation is needed to extend the lifetime of collector. The disclosure provides a capping layer in which the loss of oxygen from the capping layer is reduced to improve the operational lifetime of the collector mirror and improve availability of the lithographic apparatus.

This is achieved by a capping layer made of a low H* recombination rate material which includes a plurality of oxygen vacancies therein. Since the removal of oxygen in reduction environment has been found to result in damage to the capping layer, it has been counterintuitively found that including oxygen vacancies in the capping layer stabilizes the capping layer and enhances surface oxygen adsorption. Without wishing to be bound by scientific theory, it is believed that oxygen vacancies in the outermost surface layer contribute to attracting oxygen and the subsurface oxygen vacancies relax the surrounding lattice oxygens towards the vacancy sites and influence the adsorbed molecule by stretching or polarizing the oxygen-oxygen bond. In addition, it is believed that surface crystal defects created by the provision of oxygen vacancies act as more active adsorption sites.

The capping layer may comprise zirconium oxide. Zirconium oxide is advantageous as a capping layer as it has a low hydrogen radical recombination rate and therefore enhanced self-cleaning of volatile metal hydrides, most notably tin hydride. However, in the environment of an EUV lithography apparatus, which includes high energy EUV radiation and hydrogen radical generation, this material can be reduced to a sub-oxide or even into its metallic state. This results in increased hydrogen radical recombination at capping layer surface and consequently reduced self-cleaning of tin contamination to optical mirror. It has been found that the inclusion of a substantial oxygen vacancies in the capping layer more than doubles the activation energy required for the zirconium oxide to be reduced by surface water formation in the gas environment similar to that of an EUV lithography apparatus. Whereas ZrO2 typically starts reduction at temperatures less than 500 K (Kelvin), zirconium oxide doped with a larger cation of lower valence, which results in higher number of oxygen vacancies therein starts reduction at temperatures over 700 K. As such, a zirconium oxide capping layer with a substantial oxygen vacancies is more stable than one without oxygen vacancies, in a hydrogen environment.

The oxygen vacancies in zirconium oxide capping layer may be implemented by controlling the stoichiometry to incorporate oxygen vacancies inside the zirconia lattice.

The capping layer may further include one or more metal oxides selected from the group consisting of oxides of one or more of yttrium, cerium, calcium, magnesium, titanium, and rare-earth metals.

The addition of the one or more metal oxides to ZrO2 results in the capping layer having an increased amount of oxygen vacancies therein along with the associated increase in stability in an EUV lithographic apparatus.

In some embodiments, the capping layer may comprise zirconium oxide and yttrium oxide.

Without wishing to be bound by scientific theory, it is believed that Zr4+ cations in the zirconium oxide lattice are substituted by Y3+ cations thereby forming oxygen vacancies in order to maintain charge neutrality in the super lattice. For each two substituting yttrium cations, one oxygen vacancy is created. The presence of these oxygen vacancies causes the material to have the tendency of acquiring oxygen rather than losing oxygen by surface water formation and subsequent desorption. Similar considerations apply to the other metals mentioned.

It has also been found that the addition of $Y_2O_3$ can prevent $ZrO_2$ cracking when tetragonal ZrO2 undergoes a phase transformation change to monoclinic ZrO2.

The capping layer may comprise yttrium stabilised zirconia. The capping layer may comprise yttrium stabilised zirconium oxide.

As above, the addition of yttrium to the capping layer results in the formation of a higher number of oxygen vacancies resulting in improved stability within the reduction environment of an EUV lithography apparatus.

The one or more metal oxides may comprise from about 1% to about 25% by mole fraction of the capping layer. In some embodiments, the one or more metal oxides may comprise from about 1.5% to about 20% by mole fraction of the capping layer. In some embodiments, the one or more metal oxides may comprise about 8% by mole fraction of the capping layer, depending on the target dopant. It has been found that by doping zirconium oxide with around 8% by mole fraction of yttrium oxide, that the activation energy for the zirconium oxide to reduce is more than doubled.

In embodiments in which the capping layer includes zirconium oxide and another metal oxide, the mole fraction of zirconium oxide to the other metal oxide may be from about 70:1 to about 5:1. The thickness of the cap layer may be less than 5 nanometers in various embodiments, but may also be thicker in various suitable applications.

It has been found that, by including the metal oxide in these amounts, the stability of the optical element improves with limited EUV transmission loss through the cap layer. As such, the lifetime of optical component bearing such a cap layer is increased at a very small impact to EUV transmission efficiency.

The capping layer may comprise an alloyed metal or an alloyed metal oxide. In some embodiments, the capping layer may comprise a mixed metal oxide. The mixed metal oxide may be a metal oxide consisting of at least two types cations as an integral crystal, in some embodiments. The mixed metal oxide may be considered an oxide containing multiple metals. In some embodiments, the mixed metal oxide may represent a mixture of two or more metal oxides that form the capping layer.

Alloying the metal or the metal oxide, as described above, results in a stabilised capping layer. The combination of two or more metals to form a capping layer provides a capping layer which is more stable to reduction by hydrogen than one formed by a single metal or single metal oxide. The ratio of the two or more metals may be significantly different from 1:1 so as to optimize other properties, such as EUV transmissivity, hydrogen surface recombination rate, and hardness A layer of such a mixed-metal oxide is eminently suitable for use as a protective layer, for example on top of a Mo/Si multilayer, for EUV-reflective mirrors, metrology pellicles, reticles, or reticle-stage fiducial markers.

The alloyed metal or alloyed metal oxide may be formed of an alloy with a semimetal and/or a non-metal. The semimetal may be boron. The non-metal may be nitrogen.

As such, the capping layer may comprise zirconium oxide alloyed with boron. The capping layer may comprise zirconium oxide alloyed with nitrogen.

Similarly, the capping layer may be formed of ruthenium alloyed with boron in some embodiments. The capping layer may comprise ruthenium alloyed with nitrogen.

Doping ruthenium with boron and/or with nitrogen makes the ruthenium capping layer more amorphous and less polycrystalline. The doping also reduces the lattice mismatch between the ruthenium layer and the underlying layers, and thereby promotes adhesion and reduces island formation. Similar advantages also apply to doping zirconium oxide capping layers.

In cases where the dopant is boron, the boron may comprise from about 5% to about 15% by mole fraction of the capping layer. In some embodiments, boron may comprise about 10% by mole fraction of the capping layer. At these levels, it has been found that the capping layer is more amorphous than without the boron-doping resulting in less penetration of hydrogen and oxygen and subsequent better protection of underlying layer. In addition, the EUV optical properties of the boron-doped capping layer is comparable to or slightly better than the undoped capping layer.

In one embodiment, the capping layer may comprise $Mo_{(x-y)}Ru_xB_y$, wherein $x+y=1$, and wherein $0.01 \leq y \leq 0.15$, but various other stoichiometric ratios and various other formulations of Mo, Ru and B may be used in other embodiments. Such a capping layer is also more amorphous than a capping layer which is not doped with boron and has the advantages as described above. Such a capping layer has lower EUV reflectivity than capping layers comprising doped zirconium oxide or ruthenium, which may be desirable when EUV reflectance is undesirable, such as with pellicles or dynamic gas lock membrane where high EUV transmissivity is desired.

The capping layer may be disposed on an optical element such as a collector mirror. Since the collector mirror is very close to where the EUV radiation is generated, it is subject to some of the harshest conditions within the lithography apparatus and it is therefore desirable to have the collector mirror composed of a material which is able to withstand the harsh conditions and which is able to be cleaned in use.

The capping layer may be disposed on an optical element which may be a pellicle or a dynamic gas lock membrane. These optical elements are also exposed to high temperatures, high-power radiation, and plasma, and are also vulnerable to degradation through use, so it is also desirable for these to be stable in such an environment.

According a second aspect of the present invention, there is provided a lithography apparatus including an optical element according to the first, third or fourth aspects of the present disclosure.

As described, the optical elements with the capping layers disclosed herein, have advantageous properties compared to other optical elements. As such, a lithography apparatus comprising such optical elements also displays improved performance, including but not limited to, the ability to operate at higher power and the ability to operate for longer periods without the optical elements requiring maintenance or replacement.

According to a third aspect of the present invention, there is provided an optical element including a capping layer comprising an oxide of two or more metals. The optical element may be any of the optical elements as described herein. The optical element may be an optical element for a lithographic or other apparatus.

The capping layer comprising a mixed metal oxide provides an improved resistance to reduction by hydrogen such as described in conjunction with the first aspect of the disclosure.

The capping layer may include a metal or semimetal dopant therein. The metal dopant may comprise one or more metals selected from the group consisting of yttrium, cerium, calcium, magnesium, titanium, and rare-earth metals. The metal dopant may be present in an amount ranging from about 1% to about 25%, by mole fraction, of the capping layer. In some embodiments, the metal dopant may be provided in an amount of about 8% by mole fraction.

In one embodiment, the capping layer may comprise zirconium oxide and yttrium oxide.

According to a fourth aspect of the present invention, there is provided an optical element comprising a ruthenium capping layer that includes one or more dopants therein. The optical element may be an optical element for a lithographic or other apparatus and may be any of the optical elements described herein.

The one or more dopants may be selection from the group consisting of boron and nitrogen. As described, boron and nitrogen make the ruthenium layer more amorphous and more resistant to dewetting. The polycrystalline structure of ruthenium with boundaries and openings between the grains allows transport of atoms and small molecules. This is exacerbated by any lattice mismatch between the ruthenium layer and an underlying layer. Under the influence of EUV radiation, hydrogen plasma and other molecules, such as nitrogen, the ruthenium crystallites tend to grow thereby increasing the porosity of the ruthenium layer. It has been found that doping with nitrogen or boron makes the ruthenium more amorphous and therefore better at preventing the passage of atoms and small molecules therethrough.

The one or more dopants may be provided in an amount of from about 1% to about 25% by mole fraction of the capping layer, in some embodiments.

In one advantageous embodiment, the optical element may be a collector mirror of a lithography apparatus.

The capping layer according to any aspect of the present invention may be provided by any suitable manufacturing method and the invention is not limited to the formation technique used. For example, the capping layer may be provided by vacuum co-deposition methods, such as PECVD, dual target magnetron sputtering, ionic PVD, or ALD. The capping layer according to any aspect of the present invention may be provided on any optical element, including, but not limited to a collector mirror, a pellicle, a dynamic gas lock membrane, a reticle, and a reticle-stage fiducial marker.

It will be appreciated that features described with respect to one embodiment may be combined with any features described with respect to another embodiment and all such combinations are expressly considered and disclosed herein. As such, any features disclosed with respect to any aspect of the present invention may be combined with features disclosed with respect to any other aspect of the present invention, except where such combinations are incompatible.

BRIEF DESCRIPTION OF THE DRAWINGS

Embodiments of the invention will now be described, by way of example only, with reference to the accompanying drawings in which corresponding reference symbols indicate corresponding parts, and in which.

Figure 1:
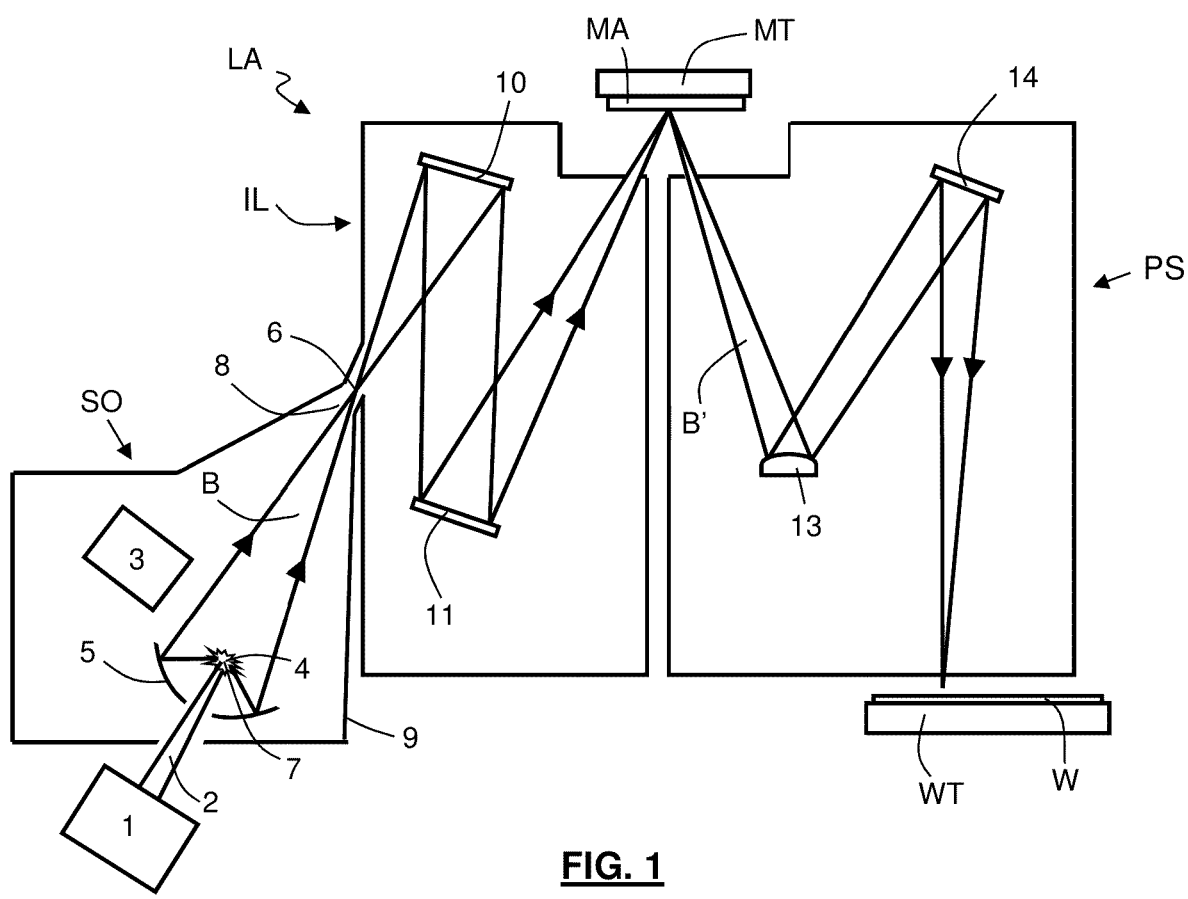
FIG. 1 depicts a lithographic apparatus according to an embodiment of the invention.

The features of the drawings are not necessarily drawn to scale. The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 shows a lithographic system. The lithographic system includes a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W.

The illumination system IL is configured to condition the radiation beam B before it is incident upon the patterning device MA. The projection system is configured to project the radiation beam B (now patterned by the mask MA to form radiation beam B') onto the substrate W. The substrate W may include previously formed patterns. Where this is the case, the lithographic apparatus aligns the patterned radiation beam B with a pattern previously formed on the substrate W. A pellicle may be located along the path of the radiation for protecting the patterning device MA such as against the patterning device MA. The illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may include mirrors 13, 14 which are configured to project the patterned EUV radiation beam B' onto the substrate W held by the substrate table WT. In some embodiments, the projection system PS may apply a reduction factor to the patterned EUV radiation beam B', thus forming an image with features that are smaller than corresponding features on the patterning device MA. For example, a reduction factor of 4 or 8 may be applied in some embodiments. Although the projection system PS is illustrated as having only two mirrors 13, 14 in FIG. 1, the projection system PS may include a different number of mirrors (e.g., six or eight mirrors) in other embodiments.

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. As mentioned, a small amount of gas (e.g. hydrogen) at a pressure well below atmospheric pressure may be provided in the illumination system IL and/or the projection system PS.

The radiation source SO shown in FIG. 1 may be of a type referred to as a laser produced plasma (LPP) source. A laser system 1 which may be a $CO_2$ laser in various embodiments, is arranged to deposit energy via a laser beam 2 into a fuel, such as tin (Sn) which is provided from a fuel emitter 3. The energy is directed along laser beam 2 to the fuel. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector or collector minor). The collector 5 may have a multilayer structure which is arranged to reflect EUV radiation. The EUV radiation may have a wavelength in the range of about 4 nm to about 20 nm, and in some embodiments, the EUV radiation may have a wavelength such as 13.5 nm. In some embodiments, collector 5 may have an elliptical configuration, having two ellipse focal points. A first focal point may be at the plasma formation region 4, and a second focal point may be at an intermediate focus 6, as discussed below.

The laser system 1 may be separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1 and the radiation source SO may together be considered to be a radiation system.

Radiation that is reflected by the collector 5 forms a radiation beam B. The radiation beam B is focused at a point to form an image of the plasma formation region 4, which acts as a virtual radiation source for the illumination system IL. The point at which the radiation beam B is focused may be referred to as the intermediate focus 6. The radiation source SO is arranged such that the intermediate focus 6 is located at or near to an opening 8 in an enclosing structure of the radiation source SO.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B' enters the projection system PS. The projection system comprises a plurality of mirrors 13, 14 which are configured to project the radiation beam B' onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time. As such a pellicle may be used to cover or otherwise protect patterning device MA.

Figure 2:
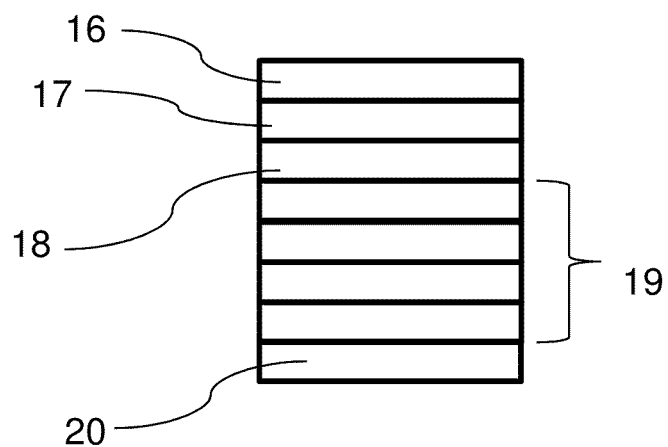
FIG. 2 schematically depicts a cross-section through a capping layer according to an embodiment of the invention.

FIG. 2 depicts a stack formed over substrate 20, including a capping layer 16. The illustrated layers are provided on a surface of substrate 20 which may be one or more of the optical elements described in the present application. For example, in some embodiments, the optical element with the illustrated capping layer may be collector 5 of FIG. 1. Alternatively or additionally, the illustrated layers may be provided on a surface of substrate 20 which may be a pellicle or dynamic gas lock membrane or on various other optical elements. There may be optional layers 17 and 18 underneath the capping layer 16. These optional layers 17, 18 may serve to reduce the lattice mismatch between the materials of the multilayer 19 and the capping layer 16 or may serve as, for example, diffusion barriers. The multilayer 19 may comprise alternating layers of silicon and molybdenum in some embodiments. Although FIG. 2 depicts four layers in the multilayer 19, it will be appreciated that there may be any suitable number of layers in the multilayer 19 and the present invention is not limited by the number of layers in the multilayer, nor to silicon and molybdenum as the multilayers. Capping layer 16, optional layers 17, 18 and multilayer 19 are disposed on a substrate 20 which may represent any of the optical elements described herein. Any suitable substrate may be used and the invention is not limited to a particular substrate nor a particular optical element. The disclosed capping layer according to the present invention may be any of the capping layers described herein and may comprise a plurality of oxygen vacancies therein. In an embodiment, the capping layer 16 comprises zirconium oxide and yttrium oxide in a mole fraction of from about 70:1 to about 5:1.

Figure 3:
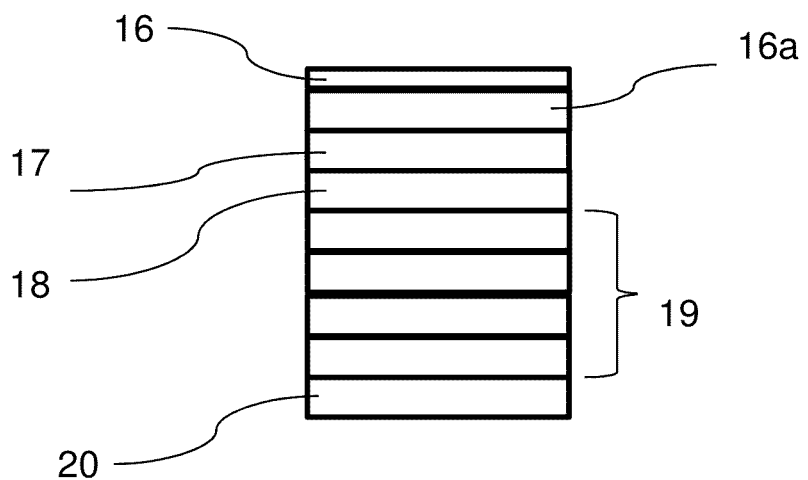
FIG. 3 schematically depicts a cross-section through a capping layer according to the present invention.

FIG. 3 is similar to FIG. 2, but the stack includes a sub-capping layer 16a below the capping layer 16. The sub-capping layer 16a may comprise a material which does not include a plurality of oxygen vacancies. As such, the capping layer 16 which includes a plurality of oxygen vacancies and may be any of the capping layers described herein, may be positioned on the sub-capping layer 16a. In this way, the capping layer comprising a plurality of oxygen vacancies may be in addition to a capping layer material which is already used on optical elements for lithography apparatus.

Although specific reference has been made to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. Where applicable, the disclosure herein may be applied to optical elements used such manufacturing tools as well as in various other types of wafer or other processing tools.

While specific embodiments of the invention have been described above, it will be appreciated that the invention may be practiced otherwise than as described. For example, the various layers may be replaced by other layers that perform the same function.

Other aspects of the invention are set out in the following numbered clauses.

1. An optical element for a lithographic apparatus, said optical element comprising a capping layer that includes a plurality of oxygen vacancies therein.
2. The optical element according to clause 1, wherein the capping layer comprises a doped zirconium oxide.
3. The optical element according to clause 2, wherein the zirconium oxide includes a trivalent cation in its oxidized state as a dopant therein.
4. The optical element according to clause 1, wherein the capping layer comprises zirconium oxide and one or more metal oxides selected from the group consisting of oxides of yttrium, cerium, calcium, magnesium, titanium, and rare-earth metals.
5. The optical element according to clause 1, wherein the capping layer comprises zirconium oxide and yttrium oxide.
6. The optical element according to clause 1, wherein the capping layer comprises yttrium stabilized zirconium oxide.
7. The optical element according to clause 4, wherein the one or more metal oxides comprise from about 1% to about 25%, by mole fraction, of the capping layer.

8. The optical element according to clause 1, wherein the capping layer comprises an alloyed metal or an alloyed metal oxide.
9. The optical element according to clause 8, wherein the alloyed metal or alloyed metal oxide comprises an alloy with a semimetal and/or a non-metal.
10. The optical element according to clause 9, wherein the semimetal and/or non-metal comprises boron.
11. The optical element according to clause 9, wherein the semimetal and/or non-metal comprises nitrogen.
12. The optical element according to clause 10 or 11, wherein the alloyed metal or alloyed metal oxide comprises alloyed zirconium oxide.
13. The optical element according to clause 10 or 11, wherein the alloyed metal or alloyed metal oxide comprises alloyed ruthenium.
14. The optical element according to clause 10, wherein the boron comprises from about 1% to about 15% by mole fraction of the capping layer.
15. The optical element according to clause 1, wherein the capping layer comprises $Mo_{(x-y)}Ru_xB_y$, wherein x+y=1, and wherein $0.01 \leq y \leq 0.15$.
16. The optical element according to any preceding clause, wherein said optical element is a collector mirror.
17. The optical element according to any of preceding clauses 1 to 15, wherein said optical element is a pellicle, a dynamic gas lock membrane, a reticle, or a reticle-stage fiducial marker.
18. The optical element according to clause 1, wherein the capping layer comprises a mixed metal oxide.
19. The optical element according to clause 1, wherein the capping layer comprises yttrium stabilised zirconia.
20. A lithography apparatus including an optical element according to any preceding clause.
21. An optical element for a lithographic apparatus, said optical element comprising a capping layer comprising two or more metal oxides.
22. The optical element according to clause 21, wherein said capping layer further comprises a metal or semimetal dopant therein.
23. The optical element according to clause 22, wherein the metal dopant comprises one or more metals selected from the group consisting of yttrium, cerium, calcium, magnesium, titanium, and a rare-earth metal.
24. The optical element according to clause 21, wherein the capping layer comprises zirconium oxide and yttrium oxide.
25. An optical element for a lithographic apparatus, said optical element comprising a ruthenium capping layer that includes one or more dopants therein.
26. The optical element according to clause 25, wherein said one or more dopants is selected from the group consisting of boron and nitrogen.
27. The optical element according to clause 26, wherein the one or more dopants are present in an amount ranging from about 1% to about 25%, by mole fraction, of the capping layer.
28. The optical element according to any of clauses 21 to 27, wherein the optical element is a collector mirror of a lithography apparatus.

The descriptions above are intended to be illustrative, not limiting. Thus it will be apparent to one skilled in the art that modifications may be made to the invention as described without departing from the scope of the claims set out below.

The invention claimed is:
1. An optical element for a lithographic apparatus, said optical element comprising:
   a substrate;
   a multilayer disposed on the substrate, the multilayer comprising alternating layers of silicon and molybdenum;
   at least one lattice mismatch reducing layer on the multilayer;
   a sub-capping layer disposed on the at least one lattice mismatch reducing layer; and
   an exposed capping layer disposed on the sub-capping layer, the capping layer including a plurality of oxygen vacancies therein, wherein the capping layer comprises zirconium oxide and one or more metal oxides, the one or more metal oxides comprise from about 1% to about 25%, by mole fraction, of the capping layer and being selected from the group consisting of oxides of cerium, calcium, magnesium, and titanium;
   wherein the sub-capping layer lacks oxygen vacancies.
2. The optical element according to claim 1, wherein the capping layer comprises a doped zirconium oxide.
3. The optical element according to claim 2, wherein the doped zirconium oxide includes a trivalent cation in its oxidized state as a dopant therein.
4. The optical element according to claim 1, wherein said optical element is a collector mirror arranged relative to a plasma formation region and configured to collect and focus extreme ultraviolet radiation.
5. The optical element according to claim 1, wherein the capping layer comprises a mixed metal oxide.
6. The optical element according to claim 1, wherein the capping layer comprises yttrium stabilised zirconia.
7. A lithography apparatus including an optical element according to claim 1.
8. An optical element for a lithographic apparatus, said optical element comprising:
   a substrate;
   a multilayer disposed on the substrate, the multilayer comprising alternating layers of silicon and molybdenum
   at least one lattice mismatch reducing layer on the multilayer;
   a sub-capping layer disposed on the at least one lattice mismatch reducing layer; and
   a capping layer disposed on the sub-capping layer, the capping layer comprising zirconium oxide and one or more metal oxides, the one or more metal oxides comprise from about 1% to about 25%, by mole fraction, of the capping layer and being selected from the group consisting of oxides of cerium, calcium, magnesium, and titanium.
9. The optical element according to claim 8, wherein said capping layer further comprises a metal or semi-metal dopant therein.
10. The optical element according to claim 8, wherein the optical element is a collector mirror of the lithography apparatus.

* * * * *